US010763191B1

(12) United States Patent
Franz et al.

(10) Patent No.: US 10,763,191 B1
(45) Date of Patent: Sep. 1, 2020

(54) DUAL IN-LINE MEMORY MODULE (DIMM) EDGEWATER SPRING (EWS) MULTI POINT CONTACT COOLING JACKET

(71) Applicant: Hewlett Packard Enterprise Development LP, Houston, TX (US)

(72) Inventors: John Franz, Houston, TX (US); Harvey Lunsman, Chippewa Falls, WI (US); Steven Dean, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/438,271

(22) Filed: Jun. 11, 2019

(51) Int. Cl.
*H05K 7/20* (2006.01)
*G06F 1/20* (2006.01)
(Continued)

(52) U.S. Cl.
CPC ............ *H01L 23/473* (2013.01); *F16F 1/027* (2013.01); *F28D 15/0275* (2013.01)

(58) Field of Classification Search
CPC ...... H02J 7/025; G06F 1/20; G06F 2200/201; G06F 1/183; G06F 1/206; H05K 7/20772; H05K 7/20236; H05K 7/20218; H05K 7/20336; H05K 7/20509; H05K 7/20763; H05K 7/20318; H05K 7/20836; H05K 1/0203; H05K 1/14; H05K 1/141; H05K 2201/064; H05K 2201/10515; H05K 3/368; H05K 7/20; H05K 7/20154;
(Continued)

(56) References Cited

U.S. PATENT DOCUMENTS 6,229,706 B1  5/2001  Cook et al.
6,233,150 B1 * 5/2001  Lin ...................... H05K 9/0039
                                                       165/185
(Continued)

OTHER PUBLICATIONS

Harwin, "SMT Shield Clips," 2018, pp. 1-2 (online), Retrieved from the Internet on Dec. 26, 2018 at URL: <harwin.com/product-highlights/smt-shield-clips/>.
(Continued)

*Primary Examiner* — Jayprakash N Gandhi
*Assistant Examiner* — Michael A Matey
(74) *Attorney, Agent, or Firm* — Sheppard Mullin Richter & Hampton LLP

(57) ABSTRACT

Systems and apparatus are provided for thermal cooling of integrated circuits, such as dual in-line memory modules (DIMMs). The apparatus includes a plurality of rows pieces that include individual leaf springs. Each of the leaf springs can exert compression to support thermal contact and a stable coupling with a received DIMM. The plurality of row pieces can be assembled to form a single structure, having a space to receive an individual DIMM for insertion. Further, each of the leaf springs are structured to allow a portion of its surface, having a conductive material disposed thereon, to support transfer of heat away from the DIMM at a point of thermal contact. The apparatus can be coupled to a printed circuit assembly (PCA) having additional cooling mechanisms installed thereon, in a manner that allows the additional cooling mechanisms to be integrated with the apparatus and provide increased thermal cooling for the DIMMs.

20 Claims, 11 Drawing Sheets

(51) Int. Cl.
*F28F 7/00* (2006.01)
*H01L 23/473* (2006.01)
*F28D 15/02* (2006.01)
*F16F 1/02* (2006.01)

(58) Field of Classification Search
CPC .............. H05K 7/20727; F28D 1/02; F28D 2021/0028; F28D 15/00; F28D 2021/0029; H01L 23/473; H01L 23/427; H01L 2224/1308; H01L 2023/405; H01L 2023/4062; H01L 2224/1358; H01L 2225/06541; H01L 2225/06589
See application file for complete search history.

(56) References Cited

U.S. PATENT DOCUMENTS

| | | | | |
|---|---|---|---|---|
| 7,151,668 | B1 * | 12/2006 | Stathakis | H01L 23/427 |
| | | | | 361/700 |
| 7,361,985 | B2 * | 4/2008 | Yuan | H01L 23/3128 |
| | | | | 257/713 |
| 7,400,506 | B2 * | 7/2008 | Hoss | H01L 23/4093 |
| | | | | 165/185 |
| 7,715,197 | B2 * | 5/2010 | Tian | H01L 23/367 |
| | | | | 165/185 |
| 8,018,723 | B1 * | 9/2011 | Yu | H01L 23/367 |
| | | | | 257/707 |
| 8,638,559 | B2 | 1/2014 | Barina et al. | |
| 9,245,820 | B2 | 1/2016 | Goldrian et al. | |
| 9,786,578 | B2 | 10/2017 | Cox et al. | |
| 2003/0011993 | A1 * | 1/2003 | Summers | H01L 23/4093 |
| | | | | 361/704 |
| 2005/0276021 | A1 * | 12/2005 | Gates | H01L 23/3672 |
| | | | | 361/709 |
| 2006/0158857 | A1 * | 7/2006 | Luckner | H01L 23/3675 |
| | | | | 361/719 |
| 2007/0223198 | A1 * | 9/2007 | Lai | H01L 23/3672 |
| | | | | 361/720 |
| 2008/0116571 | A1 * | 5/2008 | Dang | H01L 23/3672 |
| | | | | 257/721 |
| 2008/0278916 | A1 * | 11/2008 | Hsieh | H01L 23/3672 |
| | | | | 361/711 |
| 2009/0002951 | A1 | 1/2009 | Legen et al. | |
| 2009/0175016 | A1 * | 7/2009 | Legen | H01L 23/3672 |
| | | | | 361/787 |
| 2009/0190304 | A1 * | 7/2009 | Meyer, IV | G06F 1/20 |
| | | | | 361/679.47 |
| 2009/0268408 | A1 * | 10/2009 | Liu | G06F 1/20 |
| | | | | 361/710 |
| 2009/0284928 | A1 * | 11/2009 | Eckberg | H01L 23/3672 |
| | | | | 361/707 |
| 2009/0316352 | A1 * | 12/2009 | Zhu | G11C 5/04 |
| | | | | 361/679.54 |
| 2013/0306292 | A1 * | 11/2013 | Iyengar | H01L 23/3672 |
| | | | | 165/185 |
| 2014/0192476 | A1 | 7/2014 | Chainer et al. | |
| 2015/0212555 | A1 * | 7/2015 | Cox | H01L 23/427 |
| | | | | 361/679.52 |

OTHER PUBLICATIONS

National Kwikmetal Service, "NKS Division", available online at <https://web.archive.org/web/20190131062821/https://nks.com/>, Jan. 31, 2019, 5 pages.

* cited by examiner

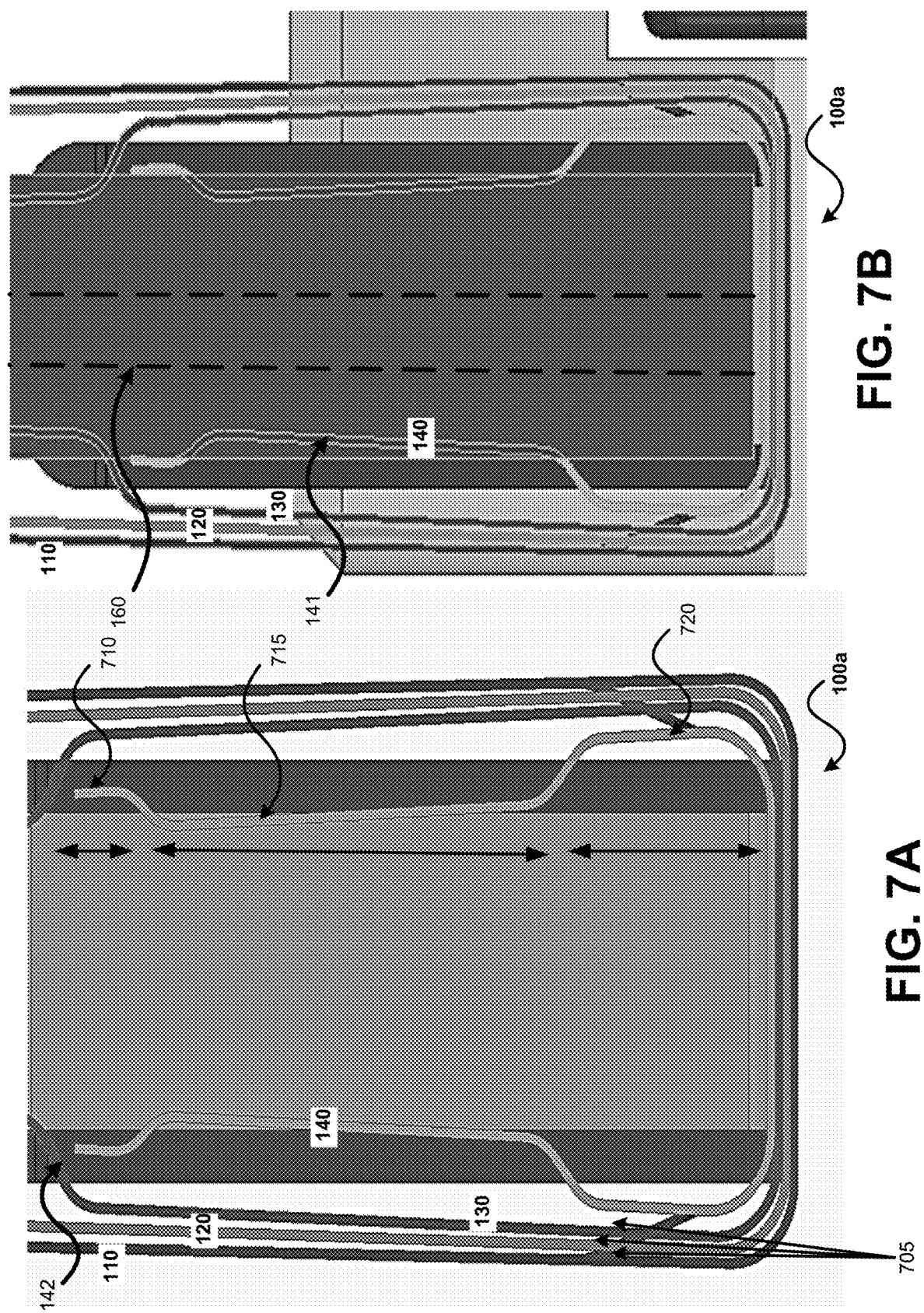

US 10,763,191 B1

DUAL IN-LINE MEMORY MODULE (DIMM) EDGEWATER SPRING (EWS) MULTI POINT CONTACT COOLING JACKET

DESCRIPTION OF RELATED ART

Modern computer systems generate large quantities of heat. While some of this heat is generated by power supplies and the like, the majority of the heat is generated by integrated circuits such as processors and memory chips. In order to function properly, these computer systems must be kept within a certain temperature range. Therefore, the heat generated by these processors and memory chips must be dissipated or otherwise removed.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 7A illustrates another side view of an example EWS cooling apparatus, according to some embodiments.

FIG. 7B illustrates an additional side view of an example EWS cooling apparatus, according to some embodiments.

Figure 1A:
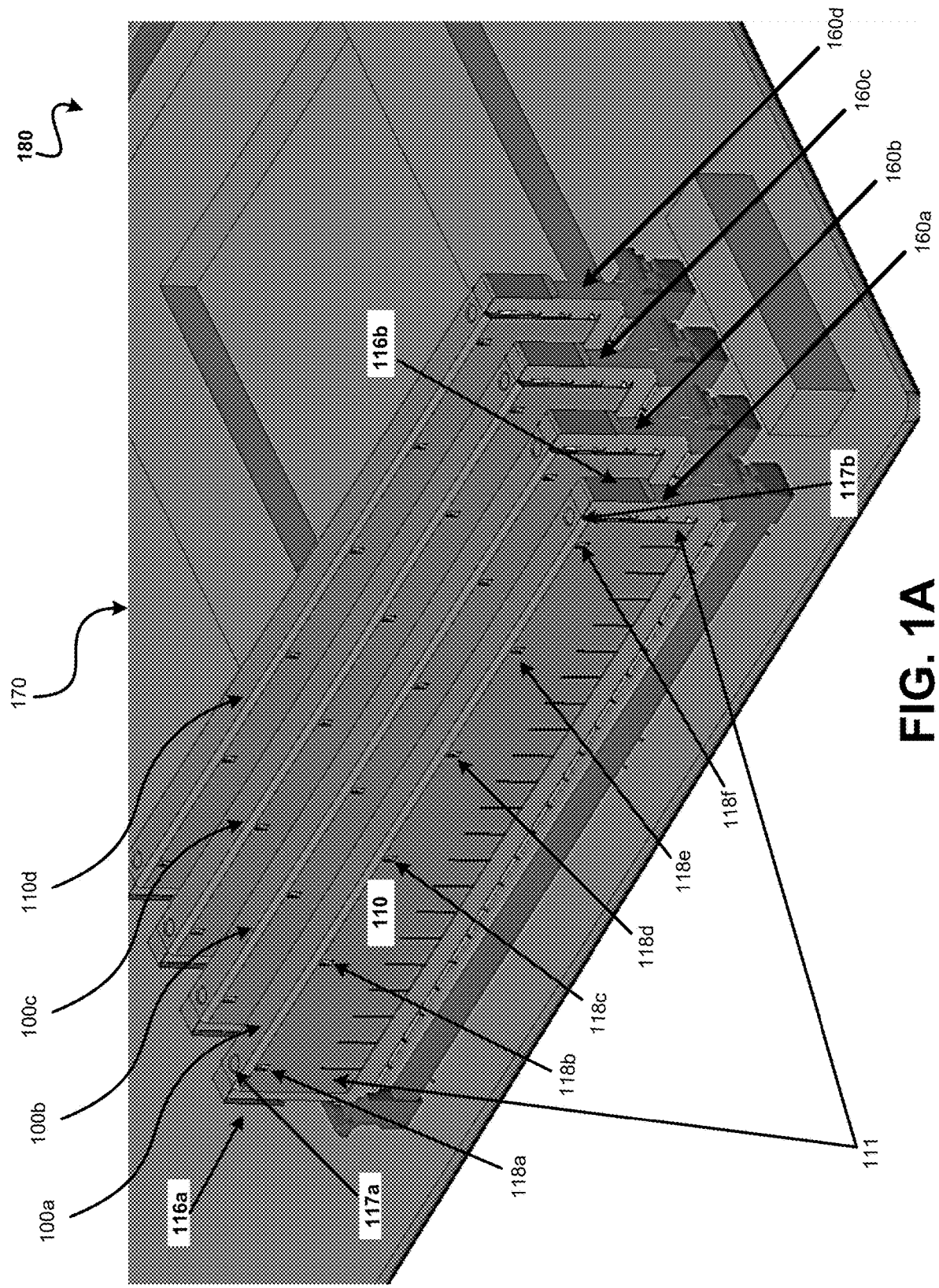
FIG. 1A depicts an example of a memory subsystem including multiple Edgewater Spring (EWS) cooling apparatuses coupled to a respective integrated circuit, for example dual in-line memory modules (DIMMs), so as to provide heat removal via thermal conduction, according to some embodiments.

The figures are not exhaustive and do not limit the present disclosure to the precise form disclosed.

DETAILED DESCRIPTION

Various embodiments described herein are directed to system and apparatus for providing thermal cooling of integrated circuits (ICs), such as dual in-line memory modules (DIMMs). There are many challenges that may be faced during real-world operations of high-performance computer environments, such as datacenters. For instance, within a fully liquid cooled infrastructure thermal management of the large number of memory modules that are typically implemented in high-performance computer devices (e.g., severs requiring significant processing capabilities) can be a concern. In the past, microprocessor cooling was a key focus in liquid cooling solutions due to their power density, but advances in memory technology to support the current generations of computers have led to higher storage capacities and faster signaling speeds, resulting in more traffic density and memory power dissipation. Accordingly, space, performance and cost of memory cooling can also be substantial, and has grown into a concern that needs to be addressed.

Memory devices, for example DIMMs, have been developed for use in various high-performance computer systems. For example, servers can utilize various DIMMs or other memory modules having specification driven by the Joint Electronic Device Engineering Council (JEDEC). In many instances, these memory devices include a housing, or case, that encloses several memory elements together. These cases are typically associated with a maximum temperature that is suggested in order to support proper function of the memory devices therein. As an example, a maximum case temperature for double data rate (DDR2) packages can be 85° C. Furthermore, many existing memory architectures include banks of memory cards, that may be set at pitches 10-12 mm. This may be driven by the electrical line distance from the central processing unit (CPU)/memory controller to the farthest DRAM cells on the memory. System height constraints may require memory cards to installed in an upright position, which can impose further constraints on cooling. In some cases, however, height constraints (e.g., in a thin laptop) can require the DIMMs to be installed at an angle relative to the main CPU board. Such limited spacing between memory modules can significantly restrict the use of many conventional cooling mechanisms used for integrated circuits and/or electrical devices. For instance, cooling pipes may be structural too large to be placed in direct contact with DIMMs in manner that allows optimal cooling. Thus, performance of memory subsystems, in particular those utilizing memory modules at tight pitches, may be impeded by required design trade-offs between thermal managing concerns and optimized capability (e.g., power consumption, number of memory devices, and the like). In order to address such thermal cooling concerns, the disclosed embodiments provide an apparatus that is particularly structured with a thin profile to accommodate close DIMM spacings. Furthermore, the structure itself has a configuration that supports direct coupling to an individual DIMM (e.g., without requiring secondary clips) which allows thermal contact to induce heat transfer away from the DIMM, thereby promoting cooling.

Referring now to the drawings, FIG. 1A illustrates an example of a memory subsystem 180, which includes utilizing the EWS cooling apparatuses disclosed herein. As alluded to above, the memory subsystem 180 can be used in a computer system, such as a server. Furthermore, as alluded to above, servers may be associated with certain temperature limitations. For example, a server might malfunction is the temperature of the server reaches and/or exceeds a threshold temperature. Heat from the use of the server can be controlled using various larger-scaled cooling systems, such as air and liquid cooling systems. Nonetheless, there are various limitations related to achieving optimal cooling on the integrated circuit level of the memory subsystem 180. The memory subsystem 180 is shown to include EWS cooling apparatuses 100a-100d installed therein, which can be used to encompass each DIMM 160a-160d in a manner that can be generally described as similar to a "jacket." Thus, through installation of the EWS cooling apparatuses 100a-100d, the memory subsystem 180 is provided mechanisms that are particularly structured to physically contact a DIMM individually, thereby removing heat from each of the DIMMs 160a-160d. Moreover, the EWS cooling apparatuses 100a-100d are structured to allow for relatively simple installation, and similarly simple removal if needed, without damaging the DIMM with cumbersome parts or adhesives. In some instances, DIMMs 160a-160d can also utilize conventional air cooling in conjunction with the thermal conductive cooling implemented using EWS cooling apparatuses 100a-100d.

In the example illustrated of FIG. 1A, the memory subsystem 180 includes a printed circuit assembly (PCA) 170. A PCA, as used herein, can be a printed circuit board populated with multiple integrated circuit components (e.g., a processor, memory, etc.). FIG. 1A shows the PCA 170 as having multiple DIMMs 160a-160b installed therein. In the illustrated example, the DIMMs 160a-160b are installed on the PCA 170 in a substantially upright position (perpendicular with respect to the length of the PCA 170). Each of the EWS cooling apparatuses 100a-100d are configured to have a form generally similar to that of DIMMs, such that that apparatuses 100a-100d can be fit over a DIMM 160a-160d, contouring to its dimensions in manner that allows for thermal contact. For instance, by installing EWS cooling apparatus 160a over DIMM 100a, heat can be transferred away from the DIMM 160a to a top surface of the apparatus 100a. In some implementations where PCA 170 also utilizes additional cooling mechanisms (e.g., heat pipe, active fluid loop, etc.) the top surface of EWS cooling apparatus 160a, having heat conducted to its surface, may further come into contact with the cooling pipe for optimal cooling of the DIMM 100a. Furthermore, the illustrated example of FIG. 1A shows a configuration where the EWS cooling apparatuses 100a-100d are position when coupled the respective DIMMs 160a-160d such that the leaf springs are facing inward (or towards the exterior surface of the DIMM). However, the EWS cooling apparatuses 100a-110d are structured in manner that also allows installation with the leaf springs facing outward (or away from the exterior surface of the DIMM). Examples of such arrangement can be seen in FIGS. 3A-3B.

As disclosed herein, the EWS cooling apparatuses 100a-100d can be a cost-efficient cooling solution, due to the material used and lack of thermal interfaces (e.g., gap pad), which are typically expensive and can drive up cooling related costs. In some embodiments, EWS cooling apparatuses 100a-100d can be constructed from a relative inexpensive material (e.g., as compared to Berrylium Copper), such as copper, that also has high conductivity properties to achieve improved thermal performance. Additionally, the EWS cooling apparatuses 100a-100d have a design that leverages an assembly of cascaded rows of leaf springs, described in greater detail in reference to FIGS. 2A-2B for example. Thus, the EWS apparatuses 100a-100d are particularly structured for coupling to DIMMs 160a-160d, as compared to some conventional mechanisms that may require an additional element used for attachment, such as an extra clip or clamp, or screws. Furthermore, each row of leaf springs comprising the EWS cooling apparatuses 100a-100d are each a thin layer. Accordingly, the EWS cooling apparatuses 100a-11d can have a thin profile, allowing them to securely encompass its corresponding DIMMs 160a-160d. Restated, the small thickness of each EWS cooling apparatus 100a-100d allows them to fit in between the space between it and another DIMM that is proximally installed on PCA 170. As an example in FIG. 1B, DIMM 190a may be pitched at distance of 0.55 inches away from DIMM 190b allowing for an second bank of memory to fit between them, such as 192a. The effective center to center distance between each DIMMs found between 170a and 170b is therefore 0.275". Despite the closely pitched DIMMs 190a, 190b, the EWS cooling apparatus 100a can have a width that is approximately 0.4 inches. This extremely thin design of EWS cooling apparatus 100a would allow the portion of apparatus 100a extending over DIMM 160a (surface facing towards the next DIMM) to fit in the space between DIMM 160a and DIMM 160b. Furthermore, the trend for memory devices progresses towards increased performance, such as pushing the limits of the number of DIMMs installed per area of the PCA 170. Due to construction from thin material and an overall slim design, the application of EWS cooling apparatuses 100a-100d may extend into future implementations. For instance, datacenters may continue to use EWS cooling apparatuses 100a-100d as a cooling solution for next generation memory devices that may have even higher DIMM counts.

Moreover, as previously described, the EWS cooling apparatuses 100a-100d have a primarily spring structure, thus the design mitigates the need to include extra elements that are used solely for coupling. In other words, the EWS cooling apparatuses 100a-100d do not require links, or other types of attachment mechanisms that having moving parts such as clamps, clips, hinges, and the like. As such, EWS cooling apparatuses 100a-100d may realize various advantages associated with having a comparatively simple structure, such as increased reliability (e.g., limited failures due to degradation of additional parts), low costs, and quick assembly. For example, the EWS cooling apparatus 100a is configured to be easily slid over DIMM 160a, which stably installs the apparatus 100a thereto. Thus, in cases where there is a high-volume inventory that may include hundreds of DIMMs, using solutions such as the EWS cooling apparatus 100a-100d may drastically reduce time dedicated to installation, while still providing the benefits of individually cooling each DIMM.

Referring to an EWS cooling apparatus 100a, FIG. 1A illustrates several elements, or pieces, included in its structure, which allows the apparatus 100a to be coupled to a corresponding DIMM 160a. According to the embodiments, an EWS cooling apparatus 100a can be inserted over the DIMM 160a as a single structure, as a result of assembling together separate individual pieces. These separate pieces comprising the EWS cooling apparatus 100a are multiple rows of leaf springs. Each of the multiple rows can be constructed as an elongated and thin panel of metal, where each row further has multiple individual leaf springs. The rows of leaf springs are substantially the same length. However, each row has a distinct height. When assembled, the rows present a "wall" of cascaded springs that can contour to the shape of the DIMM 160a, and form a "jacket" like structure (e.g., generally U-shape in geometry) that has an opening for receiving the DIMM 160a. Details of the rows of leaf springs are discussed in greater detail in reference to FIGS. 2A-2B, for example.

As seen in the example of FIG. 1A, the EWS cooling apparatus 100a can have a row 110 that, after assembly, forms the outward surface of apparatus 100a. The row 110 is shown to include a plurality of individual leaf springs 111 that are contiguously aligned to form a linear row spanning (length wise) the apparatus 100a. Also, the row 110 of EWS cooling apparatus 100a can include multiple tabs 118a-118f. The tabs 118a-118f can be slightly protruding sections of the EWS cooling apparatus 100a, which extend from the surface of rows 110. The tabs 118a-118f can be received by a corresponding opening in another row, for example during assembly, in order to jointly fasten the rows together to form a single structure. Additionally, the tabs 118a-118f can be alignment features of the EWS cooling apparatus 100a, which is described in greater detail in reference to FIGS. 8A-8C. It should be appreciated that although features are particularly discussed in reference to EWS apparatus 100a in FIG. 1A, that each of the other EWS cooling apparatuses 100b-100d include substantially the same structure and functions (not discussed again for brevity). Other features of the EWS cooling apparatus 100a will be described in greater detail below.

Figure 1B:
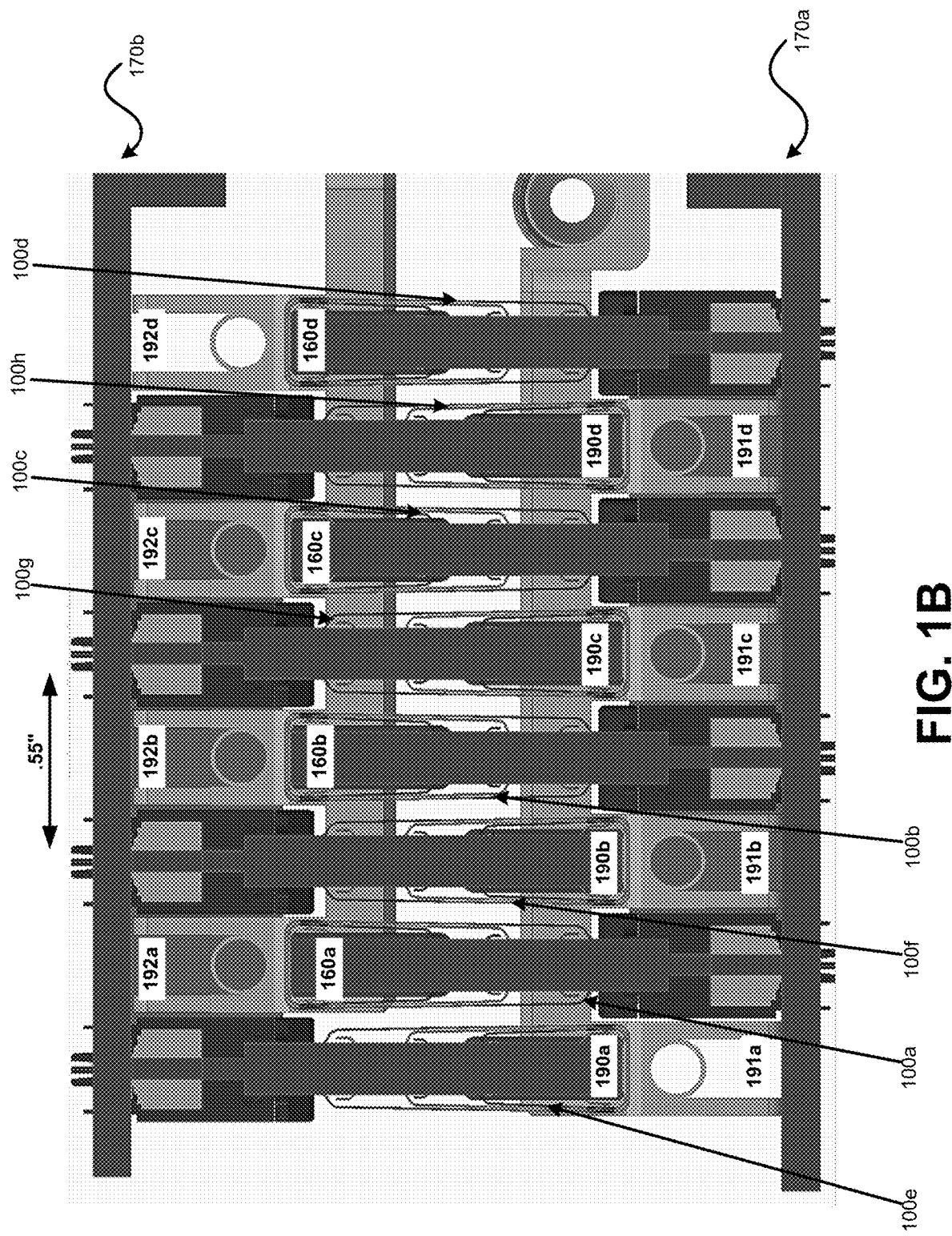
FIG. 1B illustrates a cross-sectional view of an example configuration of opposing printed circuit assemblies (PCAs), each PCA including DIMMs and EWS cooling apparatuses installed thereon, according to some embodiments.

Additionally, in FIG. 1B a cross-sectional view of an example configuration including two complimentary PCAs 170a, 170b are shown. In this example, a PCA 170a, including DIMMS 160a-160d having EWS cooling apparatuses 100a-100d attached, is arranged predominantly upright in a manner similar to the configuration in FIG. 1A. In contrast, opposing PCA 170b is positioned primarily downward. The DIMMs 190a-190d installed thereon, having EWS cooling apparatuses 100e-100h attached, are positioned such that bottom region of the DIMMs 190a-190d (e.g., area near the pins) is at the top of the arrangement. Accordingly, as seen, placing PCA 170a on top of PCA 170b facing down, allows the DIMMs 190a-190d of PCA 170b to fit in between the spacings of DIMMs 160a-160d of complementary PCA 170a (and vice versa) that are upright. Furthermore, the PCAs 170a, 170b as illustrated as including heat pipes 191a-191d, and 192-192d, respectively. In this configuration, each of the heat pipes 192a-192d of PCA 170b can contact the top surface of a corresponding DIMM 160a-160d of PCA 170a. For example, the PCAs 170a, 170b are aligned in FIG. 1B such that heat pipe 192a is positioned directly over DIMM 160a of PCA 170a. This configuration allows contact with a cooling mechanism of the complimentary PCA 170b to provide removal of heat further from the DIMM 160a-160d that has been transferred to the surface via the thermal conduction provided by the EWS cooling apparatuses 100a-100d.

Moreover, FIG. 1B serves to illustrate that the EWS cooling apparatuses 100a-100h are particularly structured having slim dimensions that can fit within extremely tight spacing. In the example configuration, a DIMM 160b including the EWS cooling apparatus 100b encompassing it can fit in a spacing of 0.55 inches between contiguous DIMMs 190b and 190c of PCA 170b.

Figures 2A, 2B:
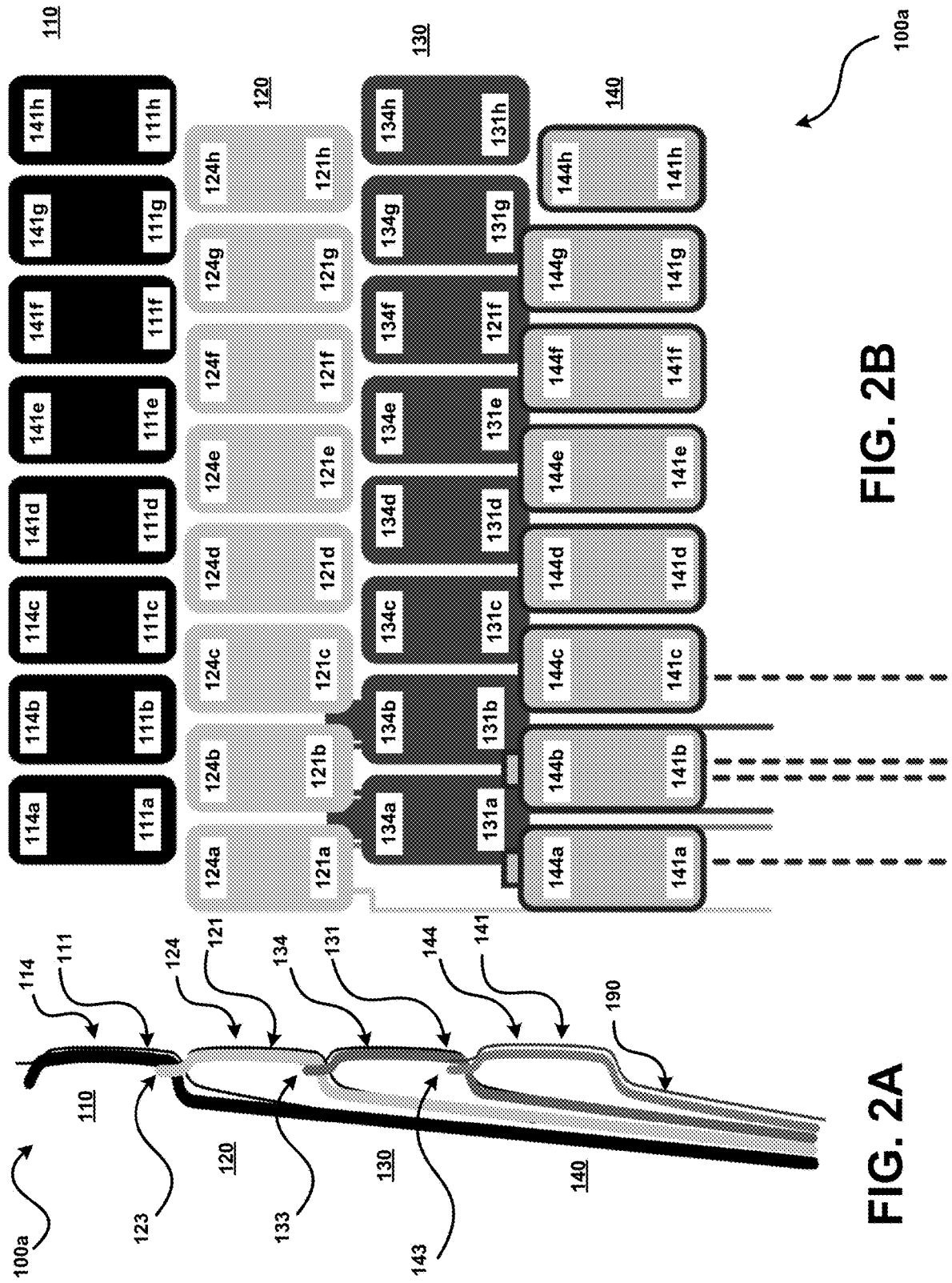
FIG. 2A illustrates a side view of an EWS cooling apparatus as shown in FIG. 1A, including multiple rows of leaf springs, according to some embodiments.
FIG. 2B illustrates a front view of an EWS cooling apparatus prominently depicting thermal contact areas of each leaf spring, according to some embodiments.

Referring now to FIG. 2A, each of the rows 110, 120, 130, and 140 of leaf springs are more prominently shown. The leaf springs 111, 121, 131, and 141 can be formed from slits in the thin metal panel used for constructing the separate row 110, 120, 130, and 140 pieces. The term "spring" can generally describe characteristics of each of the leaves comprising each of the separate rows, including: exerting tension to stabilize the received DIMM into a physical position; and absorbing some force from movement. Moreover, "spring" is a characteristic of the leaves which support the spring deflecting movement, allowing some movement (e.g., x-direction with respect to the surface of the received DIMM) of the springs for contouring around the DIMM for securely coupling thereto. For example, the multiple leaf springs 111, 121, 131, and 141 of each of the corresponding rows 110, 120, 130, and 140 respectively, may slightly deflect away from the surface of the DIMM, allowing the opening of the apparatus 100a to be wide enough for insertion of the DIMM. Additionally, the freedom of motion and/or flexibility for individual leaf springs 111, 121, 131, and 141 further facilitates contouring to DIMMs having variations in dimensions, such as varying height (e.g., +/−0.010 inches). Consequently, the solution has a wide range of applications, being able to be used with DIMMs and other IC from different vendors that may conform for differing standards.

Further FIG. 2A shows that each of the rows have a different height, which forms the multiple nested levels of springs. As seen, row 110 has the largest height, having an elongated substantially linear "stem" portion (e.g., extending past the lower rows 120, 130, and 140). The leaf springs 111 can be formed at the opposing end of the "stem," near the top portion of the row 110. The remaining rows 120, 130, and 140 have substantially similar configurations as row 110. However, each of the rows 120, 130, and 140 have a slightly decreased height from the row immediately preceding, which results in a cascading effect of the springs. For example, row 120 is lower than row 110, and subsequent row 130 is lower than row 120. In the illustrated example, row 140 has the smallest height. Thus, the leaf springs 141 of row 140 would extend the shortest distance downward from a "top" surface of the apparatus 100a at installation, for example closest to the top of the DIMM. Alternatively, the highest row 110 can have leaf springs 111 that extend the furthest distance downward at installation, being closest to the base of the DIMM (e.g., near electrical pins for installing in PCA). This is also illustrated in the perspective view of the EWS cooling apparatus 100a in shown in FIG. 3A. In some embodiments, the top row 110 can be constructed from a slightly thicker material than the other rows 120, 130, and 140 to enable both a firmer contact force and a better thermal path. Each of the rows 110, 120, 130, and 140 can have varying thicknesses, in some embodiments, which may provide improved thermal performance and contact force management. FIG. 2A also illustrates a thin insulation layer 190 that can be disposed on an external surface of each of the rows 110, 120, 130, 140. The insulation layer 190 can prevent the potential of electrical shorts that may result from metal coming into contact with a DIMM or other ICs. In some cases, the insulation layer 190 can be a coat of an insulation material. The insulation layer 190 can be a significantly thin material (e.g. ~0.0003 inches) to maintain the overall slim structure of the EWS cooling apparatus 100a and further to prevent thermal performance issues.

Each of the leaf springs 111, 121, 131, and 141 can be generally described as having a slightly curved shape, which further allows for deflection and spring movement. Furthermore, the curvature of the leaf springs 111, 121, 131, and 141 has a flat section that protrudes slightly outward (in the x direction with respect an axis aligned with a stem). The flat sections can act as contact areas 121, 131, and 141 which can come into physical contact with the DIMM installed in the EWS cooling apparatus 100a. The EWS cooling apparatus 100a is particularly structured for the contact areas 114, 124, 134, and 144 to protrude, having a substantially flat surface, which allows for stable thermal contact between the DIMM and the apparatus 100a.

Also, FIG. 2A shows that each of the leaf springs 121, 131, and 141 can have a small portion, or tab, that extends slightly upward from the contact area that is used for retaining the particular leaf spring into place. Retainer tabs 123, 133, and 143 can be formed on the lower rows 120, 130, and 140, respectively. The illustrated example shows that each row is laterally offset from the next row, which helps facilitate insertion of the retainer tabs 123, 133, and 143 into its corresponding slot. For example, leaf springs 111, 121, and 131, and 141 of the EWS cooling apparatus 100a, as a result of spring deflection, may initially expand to receive the DIMM. Then, the leaf springs 111, 121, and 131, and 141 return back to their original positions. Due to the offset angle between row 120 and 110, for instance, retainer tab 123 of row 120 can be inserted into a retainer slot of row 110 as the leaf springs 121 compresses in its return. Thus, leaf springs 121 are secured into position, having retainer tabs 123 inserted into row 110, immediately above. Accordingly, the retainer slots (not shown) in concert with the retainer tabs 123, 133, and 143 can act as fastening mechanisms which may prevent unintended movement of the leaf springs 121, 131, and 141 and ultimately mitigates instability of installing the EWS cooling apparatus 100a over a DIMM.

FIG. 2B is a front view of the EWS apparatus 100a, which more prominently illustrates each of the leaf springs included in each of the separate rows 110, 120, 130, and 140. In the illustrated example, the EWS cooling apparatus 100a includes: row 110 having leaf springs 111a-111h; row 120 having leaf springs 121a-121h; row 130 having leaf springs 131a-131h; and row 140 having leaf springs 141a-141h. Additionally, the EWS cooling apparatus 100a includes: row 110 having contact areas 114a-114h; row 120 having contact areas 124a-124h; row 130 having contact areas 134a-134h; and row 140 having contact areas 144a-144h. FIG. 2B also serves to illustrate that assembling the separate row 110, 120, 130, and 140 pieces together can form levels of cascading leaf springs 111a-111h, 121a-121h, 131a-131h, 141a-141h. Thus, the EWS cooling apparatus 100a is structured to form a "wall" or single assembled structure of all of the contact areas 114a-114h, 124a-124h, 134a-134h, 144a-144h corresponding to these springs, where the "wall" can act a contact surface that touches the installed DIMM for thermal conductance. For instance, coupling an EWS cooling apparatus 100a to a DIMM allows the contact areas 114a-114h, 124a-124h, 134a-134h, 144a-144h to physically touch a surface of the DIMM in manner that thermally conducts and allows heat to be transferred away from the DIMM. Due to the EWS cooling apparatus 100a having a structure that can conform to dimensions of a DIMM (e.g., supporting direct contact therebetween), there is no need for interfaces that have to address spaces that may be present between a DIMM and a poorly fitting cooling mechanism. Thus, EWS cooling apparatus 100a has a design that couples its contact areas 114a-114h, 124a-124h, 134-134h, and 144a-144h to the sides of the DIMM, and helps mitigate the need for additional elements, such as gap pads. As a result, employing EWS cooling apparatus 100a can lead to repeated assembly with a reduced risk of degradation that may negatively impact the function of the structure, such as gap pad damage, and pad replacement costs.

Figure 3A:
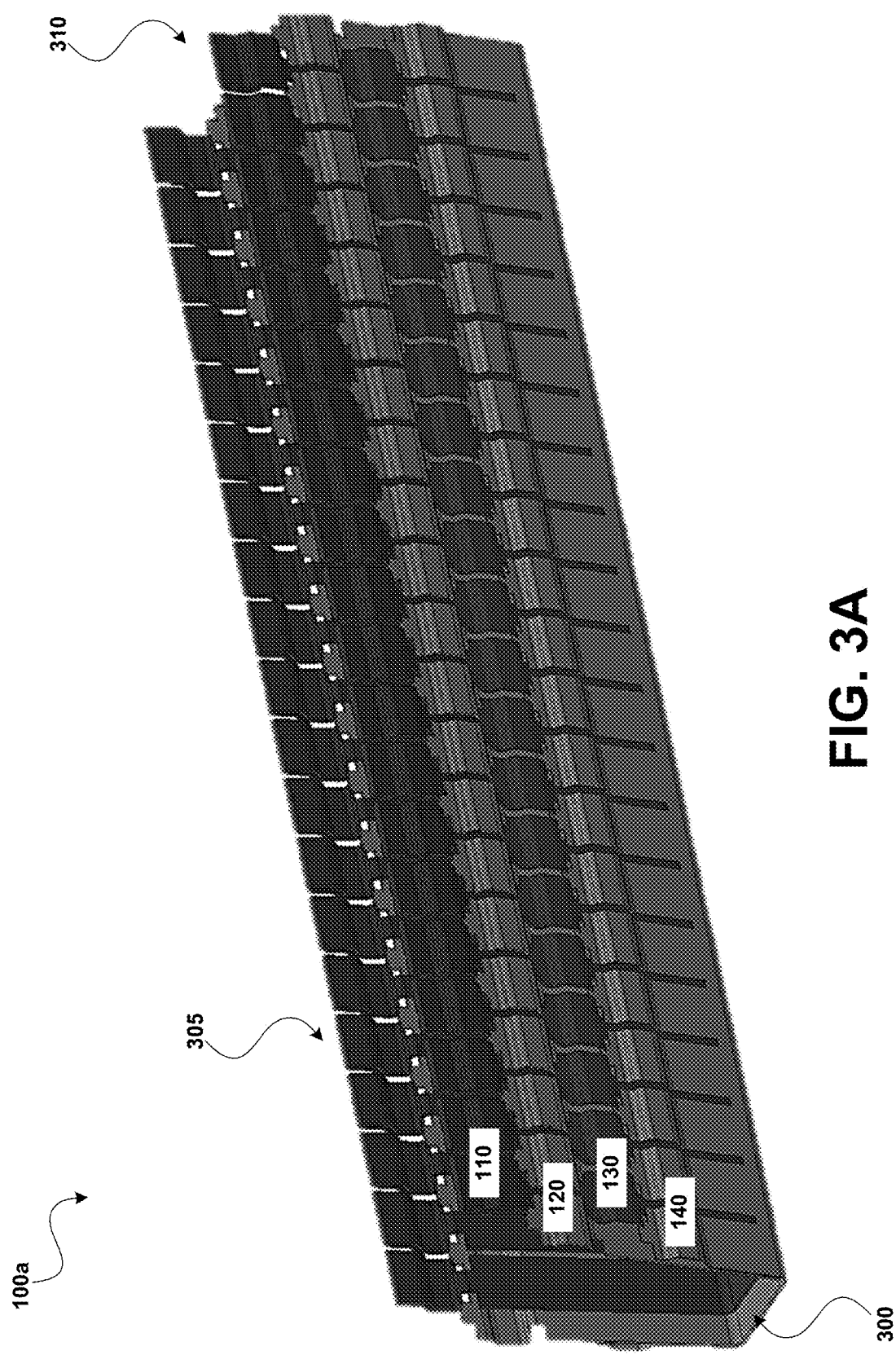
FIG. 3A illustrates a perspective view of an EWS cooling apparatus having each of the rows of leaf springs assembled together forming a single structure, according to some embodiments.
Figure 3B:
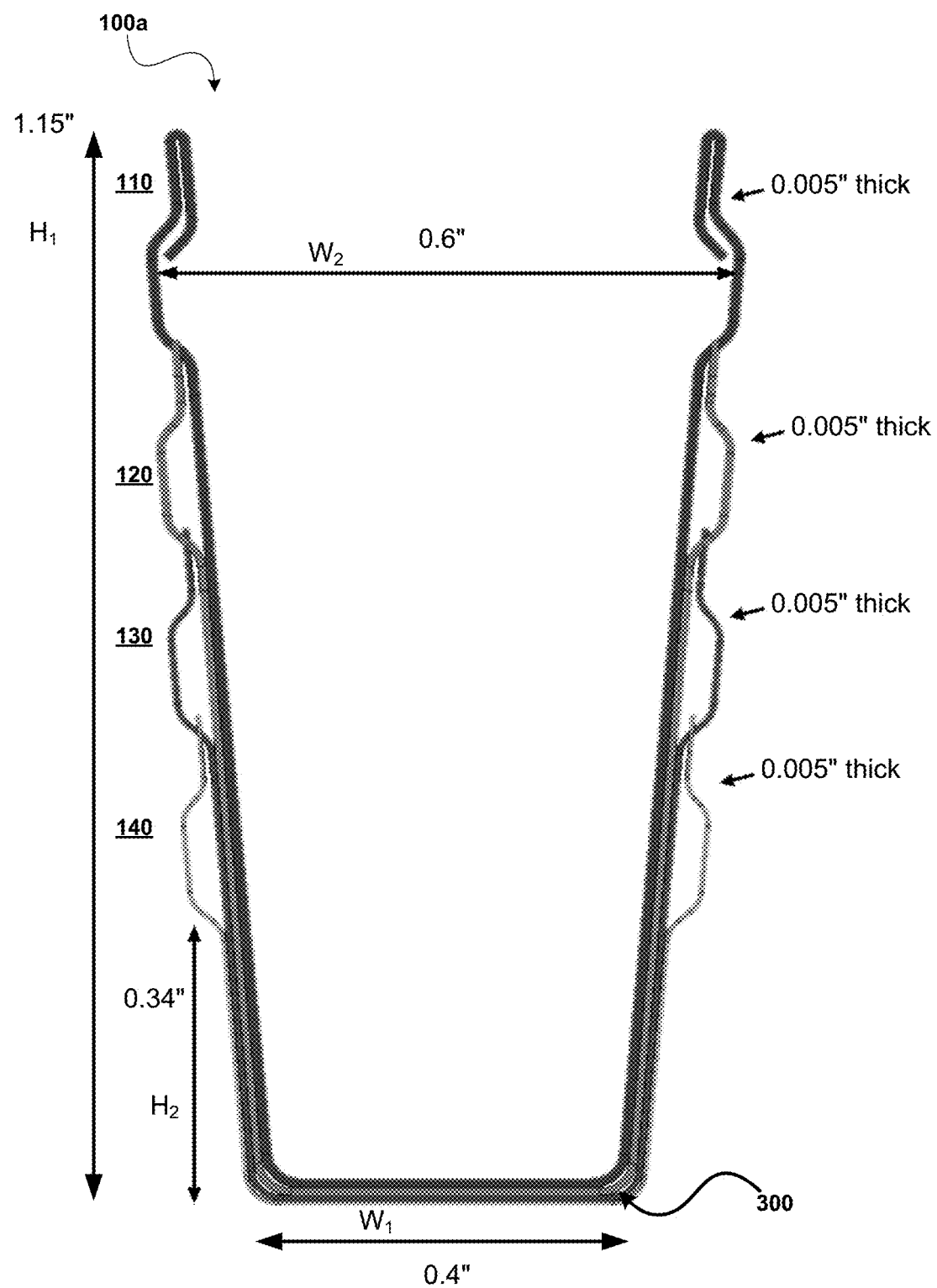
FIG. 3B is a diagram illustrating a side view of the assembled EWS cooling apparatus shown in FIG. 3A, according to some embodiments.

FIG. 3A illustrates the generally U-shaped structure of the EWS cooling apparatus 100a. It should be appreciated that in some cases, the EWS cooling apparatus 100a is coupled to the DIMM such that surface 300 lays parallel against a top portion of the DIMM (opposite end of the DIMM pins). Accordingly, for purposes of discussion, surface 300 is referred to herein as a "top" surface 300 of the apparatus 100a. FIG. 3B also shows that two lateral portions 305 and 310 of the EWS cooling apparatus 100a extend from both of the opposing sides of the top surface 300. Accordingly, the EWS cooling apparatus 100a is structured to provide thermal contact to the two sides of a DIMM, thereby partially surrounding the DIMM. As seen, side 310 is includes rows 110, 120, 130, and 140 of multiple interleaved leaf springs. Although not shown in the perspective view of FIG. 3A, the opposite side 305 includes a substantially similar structure as side 310 of the EWS cooling apparatus 100a including rows of leaf springs, and thus is not described again in detail for brevity.

FIG. 3B shows examples of dimensions that may be used for the EWS cooling apparatus 100a. As seen in the illustrated example, the EWS cooling apparatus 100a can have a total height, for instance the distance from top section 300 to the end of leaf springs in row 110. The total height (shown in FIG. 3B as H1) for the EWS cooling apparatus 100a in an example configuration is ~1.15 inches. Another height is illustrated, spanning a distance between the top section 300 and a base of the leaf springs of row 140. This height (shown in FIG. 3B as H2) for the EWS cooling apparatus 100a in the example configuration is approximately 0.34 inches. A width (shown in FIG. 3B as W1) near the "top" surface 300 of 0.4 inches, and another width (shown in FIG. 3B as W2) of 0.6 inches between the row 110 on each side 305 and 310 near the opposing end of the apparatus 100a. Additionally, FIG. 3B serves to illustrate the thicknesses of the metal panel used for constructing each of the rows 110, 120, 130, 140. In this example, all of the rows 110, 120, 130, and 140 have the same thickness of 0.005 inches. Alternatively, as described above, some embodiments can include rows 110, 120, 130, and 140 pieces having varying thicknesses.

Figure 4A:
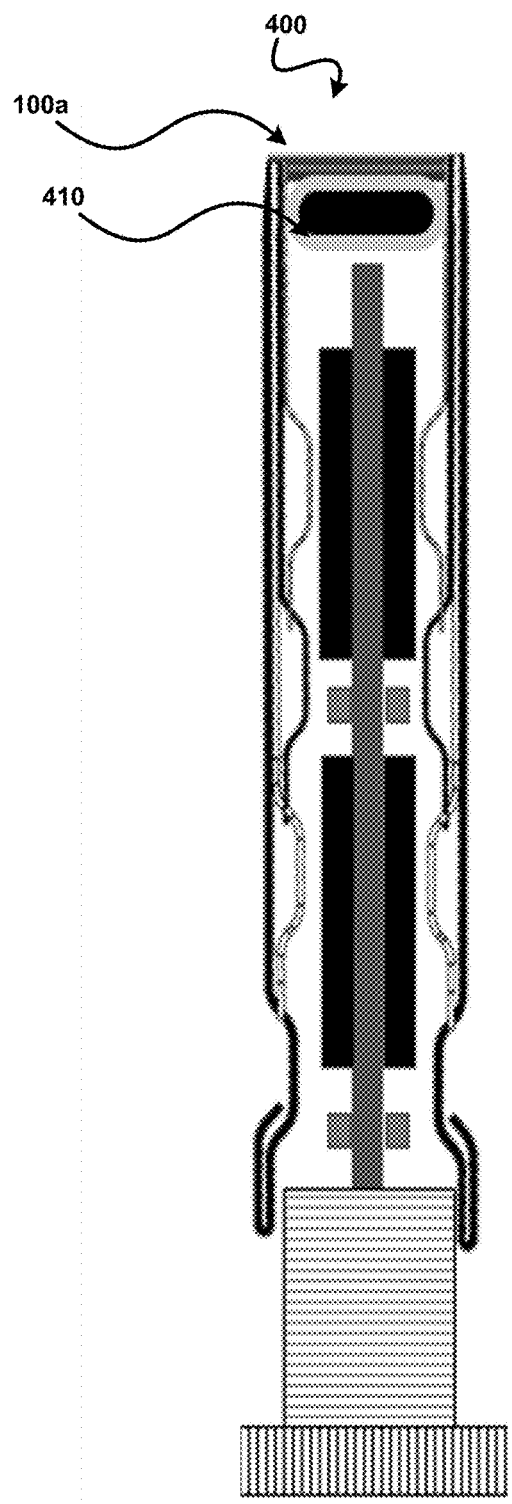
FIG. 4A is a diagram illustrating a side view of an examples configuration for coupling an EWS cooling apparatus to a DIMM, according to some embodiments.

FIG. 4A is an example of a cooling system 400 including an EWS cooling apparatus 100a and an additional cooling mechanism. In the illustrated example, the additional cooling mechanism is implemented as heat pipe 410. FIG. 4A shows a configuration for the system 400 where the heat pipe 410 is included inside of the EWS cooling apparatus 100a. In particular, the heat pipe 410 is positioned inside of the space for receiving the DIMM, in between the top section of the apparatus 100a and the DIMM. It should be appreciated that other types of cooling mechanisms may be used with (integrated or externally coupled) an EWS cooling apparatus 100a, as disclosed herein. For example, embodiments can incorporate various forms of cooling mechanisms deemed suitable for reducing heat associated with IC devices, such cooling plates, active fluid, heat pipes, and the like.

Figure 4B:
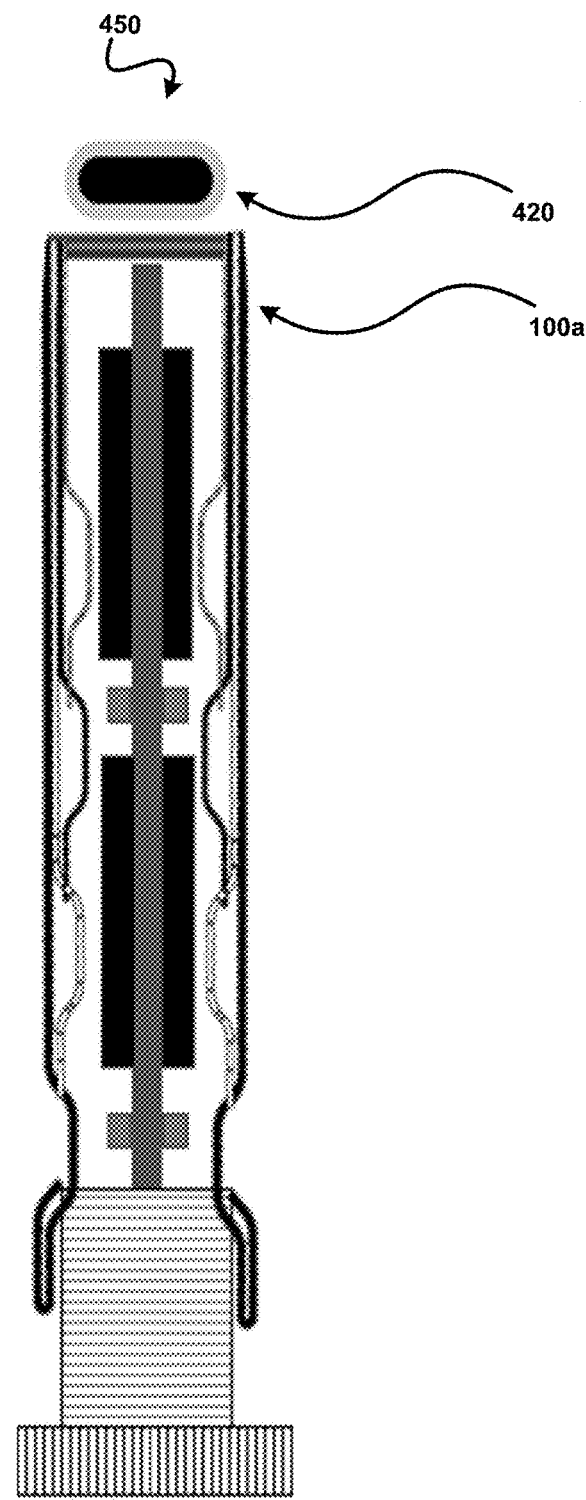
FIG. 4B is another diagram illustrating a side view of an example configuration for coupling an EWS cooling apparatus to a DIMM, according to some embodiments.

Referring to FIG. 4B, an alternate configuration for a cooling system 450 including an EWS cooling apparatus 100a and an additional cooling mechanism is shown. In this example, the heat pipe 420 resides on the PCA. FIG. 4B depicts the heat pipe 420 as being positioned above the EWS cooling apparatus 100a.

Figure 5A:
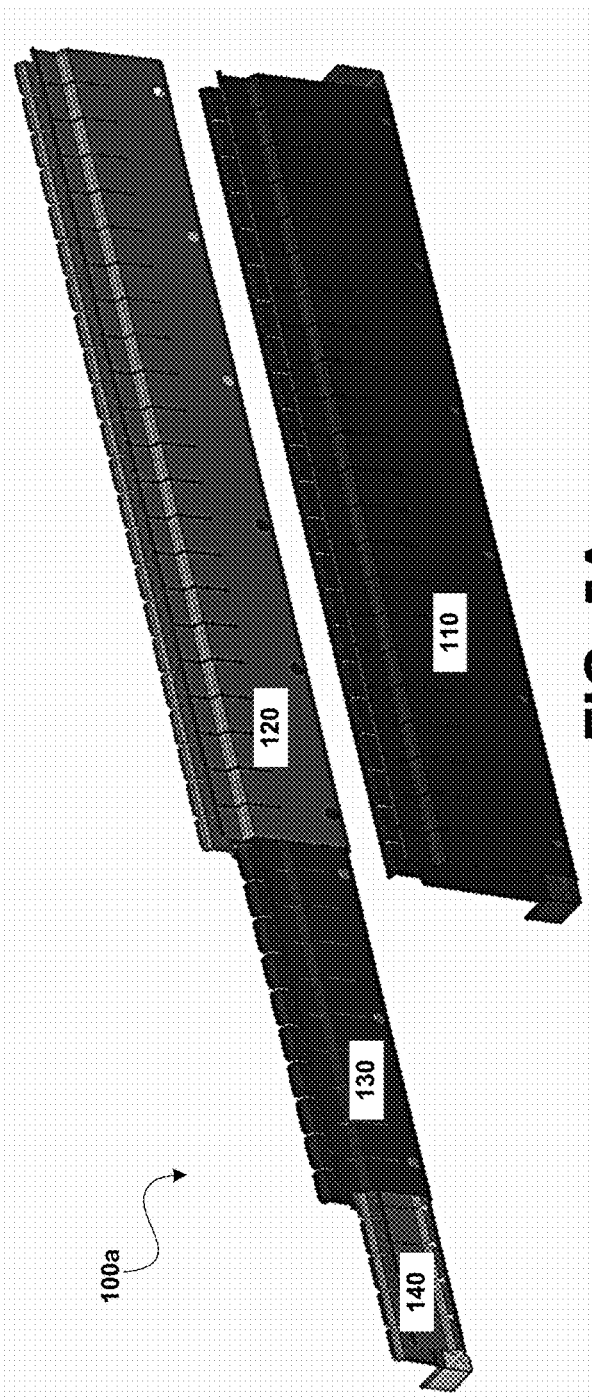
FIG. 5A illustrates an example of assembling an EWS cooling apparatus having each of the rows of leaf springs jointly coupled, according to some embodiments.
Figure 5B:
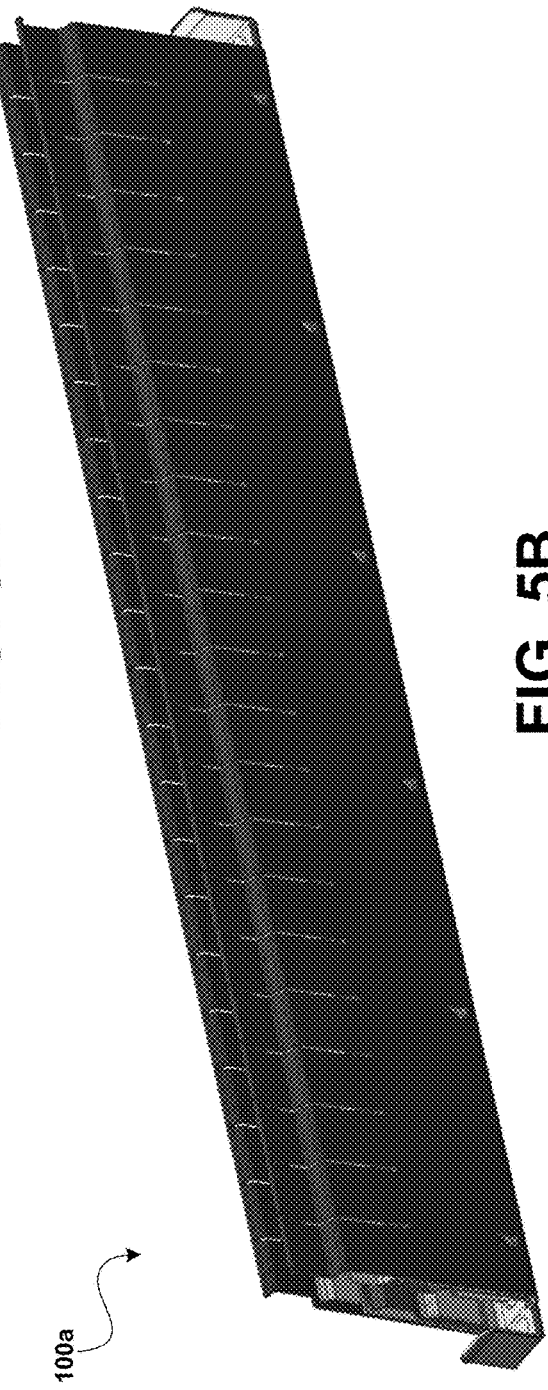
FIG. 5B illustrates another perspective view of an EWS cooling apparatus having each of the rows of leaf springs assembled together forming a single structure, according to some embodiments.

In FIG. 5A, an example of a process for assembling the separate row pieces of the EWS spring apparatus 100a is depicted. For instance, row 140, having the smallest physical size of the individual row pieces, is configured to be slidably inserted into row 130. Then, row 130, having a slightly larger physical size (as compared to row 140) is configured to be slidably inserted into row 120, in a nesting manner. Subsequently, row 110 can be slid around the previously assembled rows 140, 130, and 120. The process illustrated in FIG. 5A can result in a structure, comprised by each of the separate row 110, 120, 130, and 140 pieces being coupled together. The assembled structure, namely the EWS cooling apparatus 100a, can then slid over a DIMM for installation as a single piece. An example of the completely assembled structure of the EWS cooling apparatus is shown In FIG. 5B.

Figures 6A, 6B:
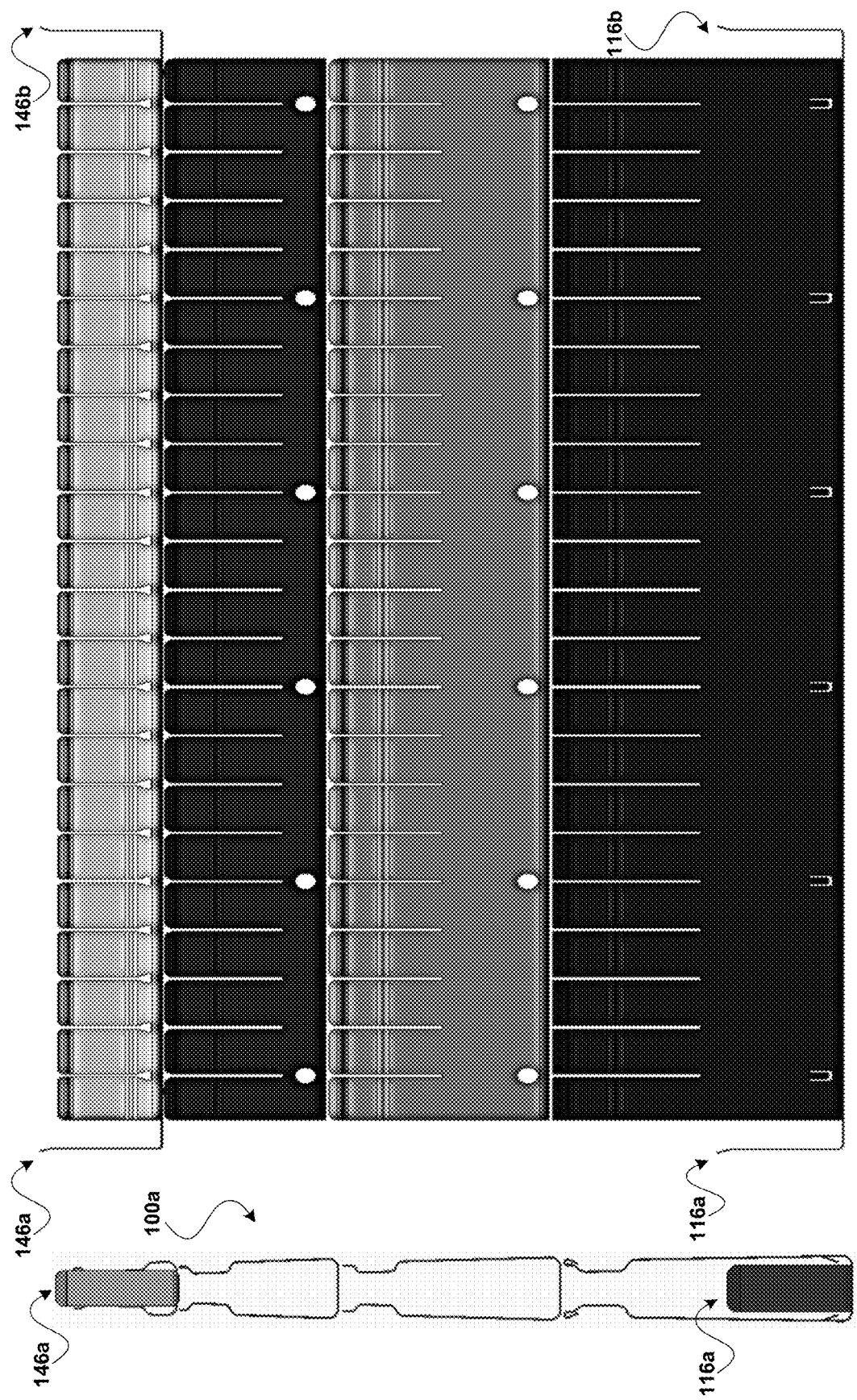
FIG. 6A illustrates a side view for each individual row of the multiple rows of leaf springs of an EWS cooling apparatus, according to some embodiments.
FIG. 6B illustrates a front view for each individual row of the multiple rows of leaf springs of an EWS cooling apparatus, according to some embodiments.

Referring to FIG. 6A, a side view of the EWS cooling apparatus 100a is shown which prominently illustrates flanges 146a and 116a. Flanges 146a and 116a are attachment features that are included in the structure of rows 140 and 110, respectively. The flanges 146a and 116a are pieces of the apparatus that extended out from the main body of the structure to form a space. As the EWS cooling apparatus 100 receives the DIMM, the flanges 146a and 116a can receive and attach to corners of the inserted DIMM. Due to the added coupling provided by the flanges 146a and 116a, the assembly can be installed securely and kept in proper position on the DIMM. FIG. 6B illustrates a front view of the rows 110, 120, 130, and 140 showing the flanges 116a, 116b on row 110 and flanges 146a, 146b on row 140. For example, flanges 146a and 146b extend from opposing sides of the row 140 (with respect to the length of row 140). The flanges 146a and 146b can be further described as being generally L-shaped in geometry and being aligned approximately perpendicular to the row 140 of multiple leaf springs. Flanges 116a, 116b extending from row 110 have a substantially similar structure and function to flanges 146a, 146b described in detail above and are not discussed again for brevity.

FIG. 7A illustrates a side view of the EWS cooling apparatus 100a, showing the portion near its top section. In the illustrated example, gaps 705 between the rows 110, 120, 130, and 140 are depicted. In some cases, the gaps 705 between layers of the EWS cooling apparatus 100a are a result of the spring deflection properties associated with the leaf springs. FIG. 7A also depicts the multiple sections of the apparatus' 100a surface that can serve as thermal contact zones, which is a feature of the disclosed embodiments. For example, certain areas (e.g., indicated in FIG. 7A by arrows) of row 140 have a configuration that lends itself for firmly pressing against an inserted DIMM. By providing multiple contact surfaces (as opposed to a ridged flat structure resulting in minimal e thermal contact due to flatness and height variations on the DIMM surfaces.) the EWS cooling apparatus 100a increases the chances that at least one of the zones will adequately contact an inserted DIMM. This provides an added benefit of increased use with different DIMMS and/or other ICs that may have a wide range of dimensions. Furthermore, FIG. 7A illustrates the retainer tab 142 protruding from row 140. As shown, the tab 142 has a leading edge that may be hidden by the upper layer, in order to prevent contact damage during installation.

FIG. 7B illustrates another side view of the EWS cooling apparatus 100a near its top section, with a DIMM 160 inserted therein. In this example, the leaf spring 141 is shown to slightly overlap with the DRAM package, which can generate a low (e.g., safe), but thermally critical, contact force.

Figure 8C:
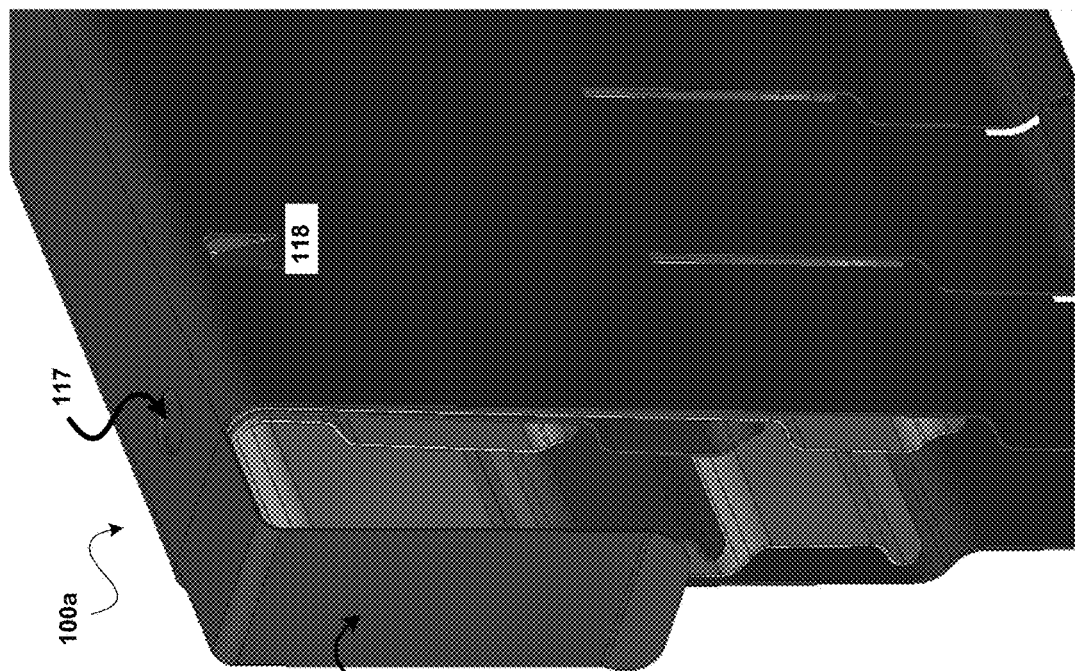
FIG. 8C illustrates yet another perspective view of an example EWS cooling apparatus showing various alignment features utilized for assembly, according to some embodiments.
Figure 8A:
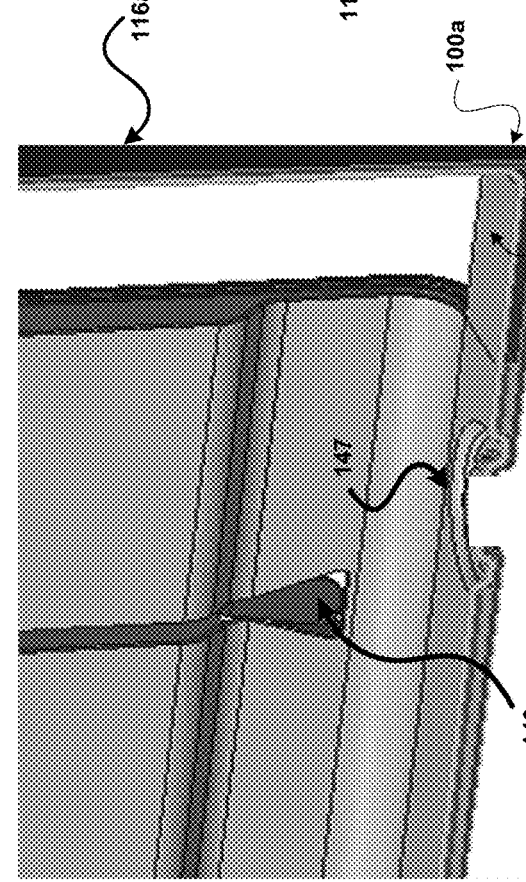
FIG. 8A illustrates a perspective view of an example EWS cooling apparatus showing various alignment features utilized for assembly, according to some embodiments.
Figure 8B:
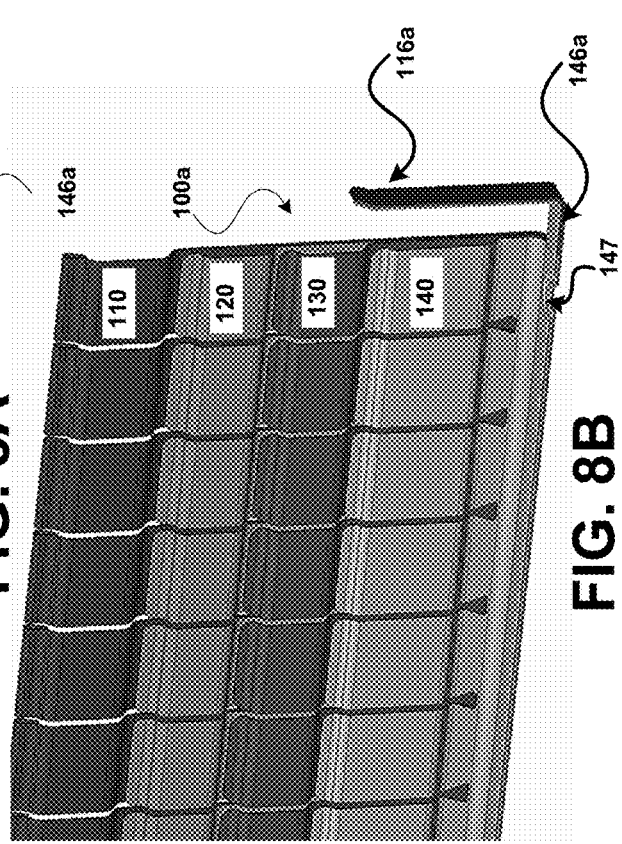
FIG. 8B illustrates another perspective view of an example EWS cooling apparatus showing various alignment features utilized for assembly, according to some embodiments.
Figure 9:
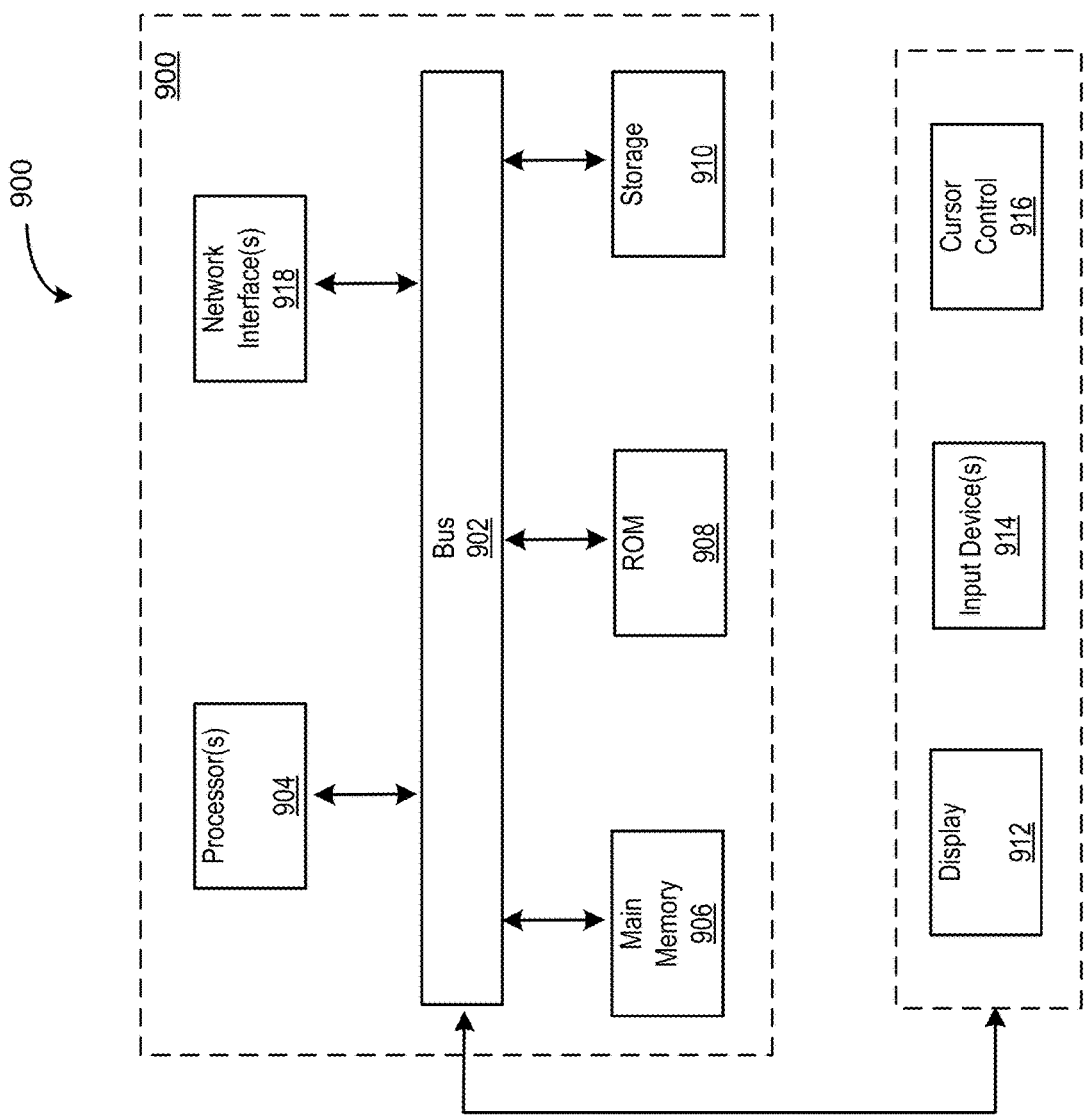
FIG. 9 is an example computing system that may be used with various features of embodiments described in the present disclosure.

FIGS. 8A-8C show multiple perspective views of the EWS cooling apparatus 100a, illustrating its various alignment features. Flange 116a of row 110 and flange 146a of row 140 are shown in FIGS. 8A-8C. The flanges 116a and 146a can have a nested assembly, as shown FIG. 8B for instance, in a manner that is similar to the nesting of the individual rows of leaf springs. FIG. 8A illustrates that a completed assembly of the apparatus 100a aligns the flanges 116a and 146a directly on top of each other, which remain in this position for installation.

Dimple 147 on row 140 and dimple 117 on row 110 are illustrated in FIGS. 8A-8C. The dimples 147 and 117 can be described as indented portions of the respective surfaces, which are generally circular in shape. FIG. 8A shows that the dimples 147 and 117 can be in the same location on their respective rows 140, 110 so that assembling the apparatus 100a aligns. When the rows 110 and 140 are aligned during assembly, the recessed portion of dimple 117 rests fully inside of the corresponding recessed portion of dimple 147, almost in a coupling, which ensures that the individual pieces are properly aligned. FIG. 8C also shows a tab 118, which an additional alignment feature of the EWS cooling apparatus 100a. For instance, FIG. 8A illustrates that tab 118 on row 110 can be inserted inside of an opening, or slot 148, in row 140 to ensure that the individual row pieces are properly aligned when assembled.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An apparatus, comprising:
    a first row piece comprising:
        a first pair of side panels; and
        a first top panel coupling the first pair of side panels in a manner that forms a space to receive a dual-in line memory module (DIMM) for insertion,
        wherein each of the first pair of side panels comprises a first row of leaf springs, each leaf spring exerting compressive force to support thermal contact and stable coupling with the received DIMM, wherein the first row of leaf springs comprises leaf springs positioned at a same first height; and
    a second row piece comprising:
        a second pair of side panels; and
        a second top panel coupling the second pair of side panels in a manner that forms the space to receive a dual-in line memory module (DIMM) for insertion,
        wherein each of the second pair of side panels comprises a second row of leaf springs, each leaf spring exerting compressive force to support thermal contact and stable coupling with the received DIMM, wherein the second row of leaf springs comprises leaf springs positioned at a same second height that is shorter than the first height, and wherein the first row piece and the second row piece are coupled together such that the first pair of side panels are aligned over the second pair of side panels forming a cascade of the first row of leaf springs at the first height and the second row of leaf springs at the second height.

2. The apparatus of claim 1, wherein each leaf spring comprises a conductive material to support transfer of heat away from the DIMM at the point of thermal contact.

3. The apparatus of claim 2, wherein the conductive material is copper.

4. The apparatus of claim 1, wherein each leaf spring has flexible spring movement allowing for insertion of the DIMM.

5. The apparatus of claim 1, wherein each leaf spring has flexible spring movement to contour to the dimensions of the received DIMM.

6. The apparatus of claim 1, wherein the first row of leaf springs comprises leaf springs each having one or more protruding portions to support thermal contact with the received DIMM near the first height, and the second row of leaf springs comprise leaf springs each having one or more additional protruding portions to support thermal contact with the received DIMM near the second height.

7. The apparatus of claim 1, wherein the second row of leaf springs comprises leaf springs each having a tab portion extending upward from the top of the leaf spring.

8. The apparatus of claim 7, wherein the first row of leaf springs each comprises leaf springs each having a notch at the base on the leaf spring for receiving a tab portion of corresponding leaf spring of the second row of leaf springs.

9. The apparatus of claim 8, wherein the first row piece is laterally offset from the second row piece to facilitate each notch of the first row of leaf springs receiving each tab portion of corresponding leaf spring of the second row of leaf springs for coupled together the first row piece and the second row piece.

10. The apparatus of claim 1, wherein the first row of leaf springs comprises leaf springs constructed from metal having a first thickness, and the second spring row of leaf springs comprises leaf springs constructed from metal having a second thickness that is different than the first thickness.

11. The apparatus of claim 1, wherein a width corresponding to the space separating the first pair of side panels is approximately 0.06 inches.

12. The apparatus of claim 1, wherein each leaf spring comprises an insulation layer disposed thereon.

13. The apparatus of claim 1, further comprising:
    a third row piece comprising:
        a third pair of side panels; and
        a third top panel coupling the third pair of side panels in a manner that forms a space to receive a dual-in line memory module (DIMM) for insertion,
        wherein each of the third pair of side panels comprises a third row of leaf springs, each leaf spring exerting compressive force to support thermal contact and stable coupling with the received DIMM; and
    a fourth row piece comprising:
        a fourth pair of side panels; and
        a fourth top panel coupling the fourth pair of side panels in a manner that forms the space to receive a dual-in line memory module (DIMM) for insertion,
        wherein each of the fourth pair of side panels comprises a fourth row of leaf springs, each leaf spring exerting compressive force to support thermal contact and stable coupling with the received DIMM.

14. The apparatus of claim 13, wherein the third row of leaf springs comprises leaf springs positioned at a same third height that is shorter than the first height of the first row of leaf springs and the second height of the second row of leaf springs, and the fourth row of leaf springs comprises leaf springs positioned at a same fourth height that is shorter than the third height.

15. The apparatus of claim 14, wherein the first row piece, the second row piece, the third row piece, and the fourth row piece are coupled together such that the first pair of side panels, the second pair of side panels, the third pair of side panels, and the fourth pair of side panels are respectively aligned over each other forming a cascade of the first row of leaf springs at the first height, the second row of leaf springs at the second height, the first row of leaf springs at the first height, and the first row of leaf springs at the first height.

16. The apparatus of claim 1, wherein the DIMM is further coupled to a printed circuit assembly (PCA).

17. The apparatus of claim 16, wherein the PCA includes a heat pipe that is thermally contacting at least the first top panel for cooling the received DIMM.

18. The apparatus of claim 16, wherein a heat pipe is positioned between the received DIMM and the first top panel for cooling the received DIMM.

19. An apparatus, comprising:
a first row piece comprising:
  a first pair of side panels; and
  a first top panel coupling the first pair of side panels in a manner that forms a space to receive a dual-in line memory module (DIMM) for insertion,
  wherein each of the first pair of side panels comprises a first row of leaf springs, each leaf spring exerting compressive force to support thermal contact and stable coupling with the received DIMM, wherein the first row of leaf springs comprises leaf springs positioned at a same first height, and wherein the first row of leaf springs comprises leaf springs each having one or more protruding portions to support thermal contact with the received DIMM near the first height; and
a second row piece comprising:
  a second pair of side panels; and
  a second top panel coupling the second pair of side panels in a manner that forms the space to receive a dual-in line memory module (DIMM) for insertion,
  wherein each of the second pair of side panels comprises a second row of leaf springs, each leaf spring exerting compressive force to support thermal contact and stable coupling with the received DIMM, wherein the second row of leaf springs comprises leaf springs positioned at a same second height that is shorter than the first height, and wherein the second row of leaf springs comprises leaf springs each having one or more additional protruding portions to support thermal contact with the received DIMM near the second height.

20. An apparatus, comprising:
a first row piece comprising:
  a first pair of side panels; and
  a first top panel coupling the first pair of side panels in a manner that forms a space to receive a dual-in line memory module (DIMM) for insertion,
  wherein each of the first pair of side panels comprises a first row of leaf springs, each leaf spring exerting compressive force to support thermal contact and stable coupling with the received DIMM, wherein the first row of leaf springs comprises leaf springs positioned at a same first height, and wherein the first row of leaf springs comprises leaf springs constructed from metal having a first thickness;
a second row piece comprising:
  a second pair of side panels; and
  a second top panel coupling the second pair of side panels in a manner that forms the space to receive a dual-in line memory module (DIMM) for insertion,
  wherein each of the second pair of side panels comprises a second row of leaf springs, each leaf spring exerting compressive force to support thermal contact and stable coupling with the received DIMM, wherein the second row of leaf springs comprises leaf springs positioned at a same second height that is shorter than the first height,
a third row piece comprising:
  a third pair of side panels; and
  a third top panel coupling the third pair of side panels in a manner that forms a space to receive a dual-in line memory module (DIMM) for insertion,
  wherein each of the third pair of side panels comprises a third row of leaf springs, each leaf spring exerting compressive force to support thermal contact and stable coupling with the received DIMM; and
a fourth row piece comprising:
  a fourth pair of side panels; and
  a fourth top panel coupling the fourth pair of side panels in a manner that forms the space to receive a dual-in line memory module (DIMM) for insertion,
  wherein:
    each of the fourth pair of side panels comprises a fourth row of leaf springs, each leaf spring exerting compressive force to support thermal contact and stable coupling with the received DIMM,
    the third row of leaf springs comprises leaf springs positioned at a same third height that is shorter than the first height of the first row of leaf springs and the second height of the second row of leaf springs, and the fourth row of leaf springs comprises leaf springs positioned at a same fourth height that is shorter than the third height, and
    the first row piece, the second row piece, the third row piece, and the fourth row piece are coupled together such that the first pair of side panels, the second pair of side panels, the third pair of side panels, and the fourth pair of side panels are respectively aligned over each other forming a cascade of the first row of leaf springs at the first height, the second row of leaf springs at the second height, the first row of leaf springs at the first height, and the first row of leaf springs at the first height.

* * * * *